(12) United States Patent
Martinez-Nuevo

(10) Patent No.: US 11,581,874 B2
(45) Date of Patent: Feb. 14, 2023

(54) METHOD AND AN APPARATUS FOR SAMPLING RATE CONVERSION

(71) Applicant: Bang & Olufsen A/S, Struer (DK)

(72) Inventor: Pablo Martinez-Nuevo, Frederiksberg (DK)

(73) Assignee: Bang & Olufsen A/S, Struer (DK)

( * ) Notice: Subject to any disclaimer, the term of this patent is extended or adjusted under 35 U.S.C. 154(b) by 0 days.

(21) Appl. No.: 16/829,411

(22) Filed: Mar. 25, 2020

(65) Prior Publication Data

US 2020/0313653 A1 Oct. 1, 2020

(30) Foreign Application Priority Data

Mar. 26, 2019 (EP) .................................. 19165114

(51) Int. Cl.
*H03H 17/02* (2006.01)
(52) U.S. Cl.
CPC ............................... *H03H 17/0248* (2013.01)
(58) Field of Classification Search
CPC . H03H 7/0248; H03H 2218/14; H03H 7/0628
See application file for complete search history.

(56) References Cited

U.S. PATENT DOCUMENTS

| | | | |
|---|---|---|---|
| 5,859,787 A | 1/1999 | Wang et al. | |
| 5,996,044 A | 11/1999 | Yasuda | |
| 6,665,694 B1 | 12/2003 | Russell et al. | |
| 7,280,878 B1 * | 10/2007 | Rossum | H03H 17/0294 341/61 |
| 7,376,690 B2 | 5/2008 | Van Den Enden et al. | |
| 7,619,546 B2 | 11/2009 | McGrath | |
| 8,619,840 B2 * | 12/2013 | Ji | H03H 17/0642 375/219 |
| 9,236,964 B2 | 1/2016 | Oh et al. | |

(Continued)

FOREIGN PATENT DOCUMENTS

| | | |
|---|---|---|
| EP | 0837561 A2 | 4/1998 |
| EP | 1347574 A2 | 9/2003 |
| KR | 100834937 B1 | 6/2008 |

OTHER PUBLICATIONS

Russell, Andrew I et al.—IEEE Transactions On Signal Processing, IEEE Service Center, NY, US; vol. 50, No. 1; Apr. 1, 2002.

(Continued)

*Primary Examiner* — Dinh T Le
(74) *Attorney, Agent, or Firm* — Harness, Dickey & Pierce, P.L.C.

(57) ABSTRACT

A signal conversion from an input signal to an output signal where the filter used is factorized so that the conversion comprises determining 1) only a first factor at each sampling time of the input signal, where this first factor is independent on the sampling times of the output signal, and 2) only a second factor at each sampling time of the output signal, where this second factor is independent of the sampling times of the input signal. This reduces the computational load for this conversion. In addition, for most filters, the factors may be calculated recursively further increasing the computational load and also reducing the storage requirements. This allows for instantaneous changes in the sampling rates or non-uniform sampling rates with low computational requirements and low memory usage.

17 Claims, 4 Drawing Sheets

(56) References Cited

U.S. PATENT DOCUMENTS

| | | |
|---|---|---|
| 2006/0273938 A1 | 12/2006 | Van Den Enden et al. |
| 2008/0151984 A1 | 6/2008 | Schmidt et al. |
| 2010/0281090 A1* | 11/2010 | Chan .................. H03H 17/028 |
| | | 708/320 |
| 2016/0079960 A1 | 3/2016 | Berscheid et al. |

OTHER PUBLICATIONS

Franck, Andreas—"Efficient algorithms for arbitrary sample rate conversion with application to wave field synthesis"; Retrieved from the Internet, 2012.

Feldman, Joel—"Discrete-time linear, time invariant systems and z-transforms", Retrieved from the Internet, Apr. 4, 2007.

Ramstad, Tor A. "Digital Methods for Conversion Between Arbitrary Sampling Frequencies." *IEEE Transactions on Acoustics, Speech and Signal Processing,* vol. ASSP-32, No. 3 (1984): pp. 577-591.

European Office Action dated Jun. 8, 2020 issued in corresponding European Appln. No. 19165114.0.

* cited by examiner

METHOD AND AN APPARATUS FOR SAMPLING RATE CONVERSION

RELATED APPLICATIONS

This application claims priority to European Patent Application No. 19165114.0 filed on Mar. 26, 2019, the entire contents of which are incorporated herein by reference.

The present invention relates to sampling rate conversion and in particular a conversion in which the new samples are determined independently of whether the input frequency varies or not.

Sampling rate conversion may be seen from e.g. U.S. Pat. Nos. 6,665,694, 5,996,044, 7,619,546, 5,859,787, KR100834937, US20060273938, US20080151984, "Efficient Arbitrary Sampling Rate Convertion With Recursive Calculation of Coefficients, Russel et al, IEEE Transactions on signal processing, vol. 50, No. 4, April 2002, pp 854-865, "Efficient Algorithms for Arbitrary Sample Rate Conversion with Application to Wave Field Synthesis, Andreas Franck, Illmenau University, 30 Nov. 2011, ISBN 978-3-96360-018-1, "Discrete-Time Linear, Time Invariant Systems and z-Transforms", Feldman, 18 May 2014, XP055646218.

The interconnection of different digital discrete-time systems operating at different rates makes sampling rate conversion a fundamental operation in most modern signal processing chains. This operation can be seen as resampling after reconstruction and, in principle, it is possible to perform it in the continuous- or discrete-time domains. However, in many practical applications, it is convenient that this conversion is carried out entirely in the discrete-time domain. One example is within the context of audio signal processing where most of the processing and interfacing between data streams is performed digitally in the discrete-time domain. Thus, on the one hand, it makes the interconnection simpler and more flexible and, on the other hand, avoids the distortion caused by the D/A and A/D converters. From a practical point of view, sampling rate conversion in the discrete-time domain has been further classified into synchronous and asynchronous sampling rate conversion. These definitions are inspired by the clock configuration setting the rates of the system. In synchronous sampling rate conversion, it is assumed that a single master clock may exist to which the different rates of the system are related by a fixed factor. This factor is generally considered to be a rational number. The asynchronous counterpart assumes several separate clocks operating at different rates. This situation gives rise to sampling rates related by an arbitrary factor that can also change over time.

Then, from the conceptual point of view, sampling rate conversion techniques commonly tackle the problem from two different sides. First, if the sampling rates are related by a constant rational factor, efficient algorithms exist that take advantage of this relationship and frequency-domain interpretations exploited in the context of filter banks. The conversion in this case consists of up-sampling followed by down-sampling both by integer factors. When both of these factors become large, the computational requirements become very demanding. This situation often arises when the values of input and output sampling rates are relatively close, e.g. from 44.1 kHz to 48 kHz or two systems with the same nominal rate presenting a small deviation between them.

In the second approach, the sampling rates are considered arbitrary, i.e. they are not assumed to have a particular relationship between them and are allowed to vary with time. Note that this potential fluctuation of the conversion ratio implies that both the input and the output samples can correspond to non-uniform samples of the underlying continuous-time signal. This is a more general case clearly containing the cases described above.

Arbitrary sampling rate conversion entirely in the digital domain is commonly addressed by means of a time-varying discrete-time filter. This approach can be shown to be equivalent to resampling after reconstruction, i.e. reconstructing the sequence of samples as a continuous-time signal and sampling it again at a different rate. The challenge lies in efficiently updating the filter coefficients at each time step and performing the corresponding filtering operation. A common strategy in the literature is based on either storing a large number of samples and performing simple interpolation—e.g. first-order or cubic interpolation- or storing fewer samples at the expense of more sophisticated interpolation techniques. In this approach, there is a trade-off between computational complexity and memory requirements.

It is an object of the invention to derive a more general arbitrary sampling rate converter, referred to as non-uniform sampling rate converter, which is computationally efficient, has low memory requirements, and can efficiently adapt to instantaneous and abrupt changes in the input or output sampling rate.

In a first aspect, the invention relates to a method for converting an input signal to an output signal, such as wherein at least one of the input signal and the output signal is non-uniform,
  the input signal representing, at each of a plurality of first points in time, tau, a value x(tau),
  the output signal representing, at each of a plurality of second points in time, t, a value y(t),
  the method comprising the step of generating each y(t) by multiplying:
    a first factor depending on the second points in time but not the first points in time with
    a sum of values being x(tau) multiplied by a second factor, the second factor depending on the first points in time but not the second points in time.

Actually, the points in time, tau, may be termed tau_n, as these points in time will be a sequence of points in time. The same is the situation for the points in time t, which may be termed t_m. n and m being integers describing the position in the sequence.

A discrete-time algorithm for non-uniform sampling rate conversion may be obtained that presents low computational complexity and memory requirements. It generalizes arbitrary sampling rate conversion by accommodating time-varying conversion ratios, i.e. it can efficiently adapt to instantaneous and abrupt changes of the input and output sampling rates. This approach is based on appropriately factorizing the time-varying filter used for the conversion. Common filters that satisfy this factorization property may be those where the underlying continuous-time filter consists of linear combinations of exponentials, e.g. those described by linear constant-coefficient differential equations. This factorization separates the computation into two parts: one factor solely depending on the output sampling instants and the other consists of a summation—that often can be computed recursively—whose terms depend solely on the input sampling instants. The number of values in the sum may be given by a relationship between input and output sampling instants. Thus, non-uniform sampling rates may be accommodated by updating the factors involved and adjusting the number of values added. When the impulse response consists of exponentials, computing the factors may be done recursively in an efficient manner.

In general, the input signal has a value, x, at each of a plurality of points in time, tau. Clearly, the value, x, will vary over time, as the signal may represent an audio signal, for example.

The input signal may be analogue or digital or have any other format. The input signal may be continuous, packetized or be on any desired form.

The value, x, may be or may have been determined at the individual points in time, tau, from an analogue signal, such as using a sampler or converter, such as an A/D converter. The points in time, tau, may be equidistant in time or not. Usually, signals, including input signals, are desired sampled at a particular frequency, but a number of problems may be present which either disturb the sampling clock, delay transport of some packets compared to other packets or the like, so that the points in time, tau, are not equidistant in time or the corresponding x values are not available when required for the conversion.

The value x, and the value y, may be a signal strength value, a loudness value, or the like, of the pertaining signal. Often, the x value would be the output of a signal sampler or converter.

Naturally, also the output signal may be analogue, digital, packetized or the like. The output signal has, at the points in time t, values y(t) which also usually vary, as the output signal may represent an audio signal, for example.

Preferably, the conversion from the input signal to the output signal does not alter the overall contents of the signal, so that the output signal corresponds to the input signal. It may be said that the output signal carries the same information as the input signal and/or that the information is preserved. In this context, "corresponds to" may entail that the output and input signals represent the same audio signal and/or that the input and output signals have the same frequency contents, at least within a desired frequency band, such as between 20 Hz and 20 kHz or between 50 Hz and 10 kHz.

Clearly, a first point in time, tau, may be identical to a second point in time, t, but often, these will be different.

As mentioned, the invention comprises a particular manner of determining each y value (or y(t) as it is the y value for a given point in time t) in that the overall function used for converting the input signal into the output signal may be factorized (or split up) into two factors, one of which is depending on the points in time at which an input signal value, x, exists (but not on the points in time at which a value of the output signal is desired), and one of which depends on the points in time at which an output signal value, y, is desired (but not on the points in time at which an input signal value exists).

Thus, the method comprises the step of generating each y(t) by multiplying:
 a first factor depending on the second points in time but not the first points in time with
 a sum of values being x(tau) multiplied by a second factor, the second factor depending on the first points in time but not the second points in time.

That the first factor does not depend on the first points in time, tau, in this context, means that the first factor will not change, if the first points in time change or if a rate defined by the first points in time changes. The first factor depends on, however, at which points in time, t, the output signal amplitude values are desired. The same clearly is the situation for the second factor, which, however, depends on the first points in time but not the second points in time.

The first and second factors may constitute or form part of the overall filter function desired for converting the input signal into the output signal, as is described further below.

A simplification is seen when the factors or the sum may be calculated recursively, which is the situation if the filter is represented as an exponential or a linear combination thereof. In this manner, historic values may be stored so that only the newest portion(s) need be determined to arrive at the factor. If the rates of the points in time t and/or tau are uniform, the calculations may become even simpler.

Often, the input signal is non-uniform such as when representing x(tau) where tau are not equidistant in time. In this context, not equidistant in time will mean that the differences between neighbouring tau values vary more than what old-fashioned hardware is able to correct or accept.

In one situation, the input signal represents x(tau) where x(tau1), x(tau2), x(tau3) and x(tau4) exist, where tau1 and tau2 are neighbouring and tau3 and tau4 are neighbouring, and where |tau2−tau1|>1.001*(|tau4−tau3|). Neighbouring taus are neighbouring taus in the sequence of taus in the input signal. If the signal is digitized and/or sampled, the neighbouring packet or digital/sampled values will have neighbouring taus. The difference is at least 0.1% but may be larger, such as 1%, 2%, 5%, 10% or even 25%, 50% or more.

A signal may be non-uniform for different reasons. In one situation, the signal may be originally non-uniformly sampled in time so that the tau values are not equidistant.

However, even a uniformly sampled signal may become non-uniform if samples are dropped, delayed or missing. In the situation where, for example, the signal is transported over a packet-based network, packets may be lost or delayed to a degree where the recipient is not able to re-assemble the packets in the right order and thus decides to drop the packet.

In that situation, even with a uniformly sampled signal, the time distance between the sampling instants of the resulting samples will become non-uniform.

Clearly, the second points in time, t, may be determined as a function of the first points in time, tau. However, often, it is desired that the second points in time, t, are predetermined, such as equidistantly with a desired frequency. Then, a clock may be provided for outputting a signal from which the second points in time may be determined.

In one embodiment, the second factor is calculated for each first point in time.

In one embodiment the second factor is not calculated for each second point in time not being identical to a first point in time. Thus, the second factor may be calculated only at the first points in time.

Similarly, in one embodiment, the first factor is calculated for each second point in time. It may be desired that the first factor is not calculated for each second point in time not being identical to a first point in time.

In one embodiment, the sum is a sum of values each corresponding to a first point in time. Usually, different values of the sum correspond to different first points in time. Then, a value for one first point in time may remain constant once this point in time has passed and/or the value has been determined. Such values may then be stored and subsequently retrieved for future calculations of the sum. As mentioned above, the number of values in the sum may be constant or may vary with e.g. a relation between rates/frequencies of the first/second points in time. Additionally or alternatively, the different first points in time of the values of the sum may be a predetermined number of latest first points in time prior to the second point in time for which y(t) is determined.

In a preferred embodiment, the first and/or second factors are complex exponential functions. Filters of this type are well known and have the advantage that they may be determined recursively, which simplifies and speeds up the calculation even further.

A second aspect of the invention relates to an apparatus for converting an input signal to an output signal such as wherein at least one of the input signal and the output signal is non-uniform, the apparatus comprising:
  a signal input,
  a signal output,
  a controller being configured to:
    receive the input signal from the input, the input signal representing, at each of a plurality of first points in time, tau, a value x(tau),
    generate the output signal representing, at each of a plurality of second points in time, t, a value y(t), y(t) being determined by multiplying:
      a first factor depending on the second points in time but not the first points in time with
      a sum of x(tau) multiplied by a second factor depending on the first points in time but not the second points in time and
    output the output signal from the output.

Clearly, all aspects and embodiments of the invention may be combined if desired.

Thus, the input and output signals may be as those described above.

In the present context, a signal input may be one or more conductors which are configured to receive the input signal. As mentioned, the input signal may be analogue or digital, so that the input may be configured to receive any type of signal. The input may, for digital signals, be a MAC, NIC or the like configured to receive and decompose/decrypt a digital signal with a predetermined format, such as PCM. Alternatively, an analogue signal may be fed to the input. Then, the signal also usually conforms to a protocol, such as limiting the maximum voltage thereof.

The input and/or output may be configured to communicate with a storage of any kind, such as a DVD, CDROM, flash memory, SDHD, RAM, ROM, PROM, or the like, for holding the input and/or output signal.

Clearly, the input may additionally or alternatively receive wireless signals, and/or the output may additionally or alternatively output wireless signals, such as optical signals and/or radio wave signals, such as Wi-Fi or Bluetooth. Then, the input/output may comprise a receiver/emitter/antenna/detector to receive/emit this signal. The receiver/antenna/detector may be configured to convert a wireless signal into an electrical signal handled by or to be handled by the controller. Controllers may operate on other types of wireless signals, such as optical signals.

The signal output may be configured to output the signal in/on any format/protocol as desired. Thus, the output may output a signal on electrical conductors, optical cable(s), an emitter/antenna for a wireless signal or the like. Any protocol may be used, such as any of the above protocols and signal types.

In one embodiment, the output signal is fed to one or more amplifier(s) and then to one or more loudspeakers. In another embodiment, the output signal is streamed to one or more receivers.

The controller may be a processor, controller, DSP, FPGA or the like. The controller may be a monolithic unit or a distributed controller comprising a number of processors or the like configured to communicate with each other.

The controller is configured to perform the process described in relation to the first aspect of the invention.

Naturally, a signal conversion may be performed on the input signal before entering the calculation/controller. Thus, the input signal may be filtered, limited, A/D converted, sampled or the like before entering the calculation/controller. In one embodiment, the input signal is sampled to determine the value x(tau) at different first points in time, tau.

Also, the output signal may be post processed to have any desired format, before outputting at the output. In one embodiment, the calculation is performed resulting in individual values, y(t), which are converted into an analogue output signal before outputting.

In one embodiment, the signal input comprises an analogue signal input and a A/D converter. Then, the analogue input signal may be sampled and the sampled values, x, be fed into the calculation.

In one embodiment, the signal input comprises an element configured to receive data packets and derive from each data packet, a value x(tau) and a point in time, tau. In this manner, the signal may already be sampled so that the x and tau values are comprised within each packet. Then, the arriving at this data may be to derive it from each packet. In this context, it may be desired to provide a delay between receiving of a packet and the forwarding of the derived data to the calculation as packets, in packet-based networks, may take different routes, so that one packet may be delayed vis-à-vis other packets of the same signal. A delay thus may allow a delayed packet to arrive and the corresponding information be fed to the calculation in time. If the packet is delayed, the data thereof (the x value) may be out of synchronization with the calculation. Clearly, this value may then be left out, if the delay is excessive. The present calculation, however, facilitates handling of even delayed data, as it is not limited to fixed-frequency signals.

Usually, the apparatus will further comprise a clocking element for generating the second points in time, t. Then, these points in time may be used in the calculation for determination of the y values. A clock may output any type of signal, such as YYYYMMDDHHMMSSXXXXX, an increasing integer (which may wrap-around when reaching a maximum number), a signal flank (high-to-low or vice versa), or the like. This signal is usually output with a desired frequency. If the second points in time, t, are not received directly from the clocking element, these may be assigned by e.g. an increasing integer, where the actual timing of the clock is then received from the clock. Clearly, as mentioned above, even jitter or other variations of this clock may be taken into account by the calculation, as the calculation is not limited to a fixed-frequency output signal or even an output signal with values which predominantly have a desired frequency.

A last aspect of the invention relates to a computer program stored on a computer-readable medium for converting an input signal to an output signal such as wherein at least one of the input signal and the output signal is non-uniform, the computer program comprising executable instructions that cause a computer to:
  receive the input signal representing, at each of a plurality of first points in time, tau, a value x(tau),
  generate the output signal, the output signal representing, at each of a plurality of second points in time, t, a value y(t) by multiplying:
    a first factor depending on the second points in time but not the first points in time with a sum of x(tau) multiplied by a second factor depending on the first points in time but not the second points in time, and output the output signal.

In the present context, a computer program may be a set of instructions or any degree of compilation thereof toward machine instruction level. The program may form part of a larger program giving the computer also other capabilities, such as input and/or output signal selection, filtering, amplifying, limiting, or the like, as well as protocol conversion/selection, and the like.

The computer-readable medium may be any type of storage, such as ROM, RAM, PROM, EPROM, EEPROM, flash, HD, CD-ROM, DVD, optical or magnetic. Clearly, the program may be split up into portions stored individually, such as in different storages or storage partitions, if desired. Alternatively, the computer program may comprise additional portions enabling the computer to perform also other tasks.

The input and output signals may be as those described above. The computer may comprise a controller as that described above.

The computer also may comprise an input and an output as those described above. Clearly, the required communication between the input/output and the controller/processor may be facilitated in any desired manner, such as via one or more data busses, controllers, converters, amplifiers, filters, or the like. Also, if desired, the computer may comprise antennas/receivers/emitters/NICs/MACs or the like for transporting the signals.

Preferred embodiments of the invention will now be further described with reference to the drawings, in which.

Figure 4:
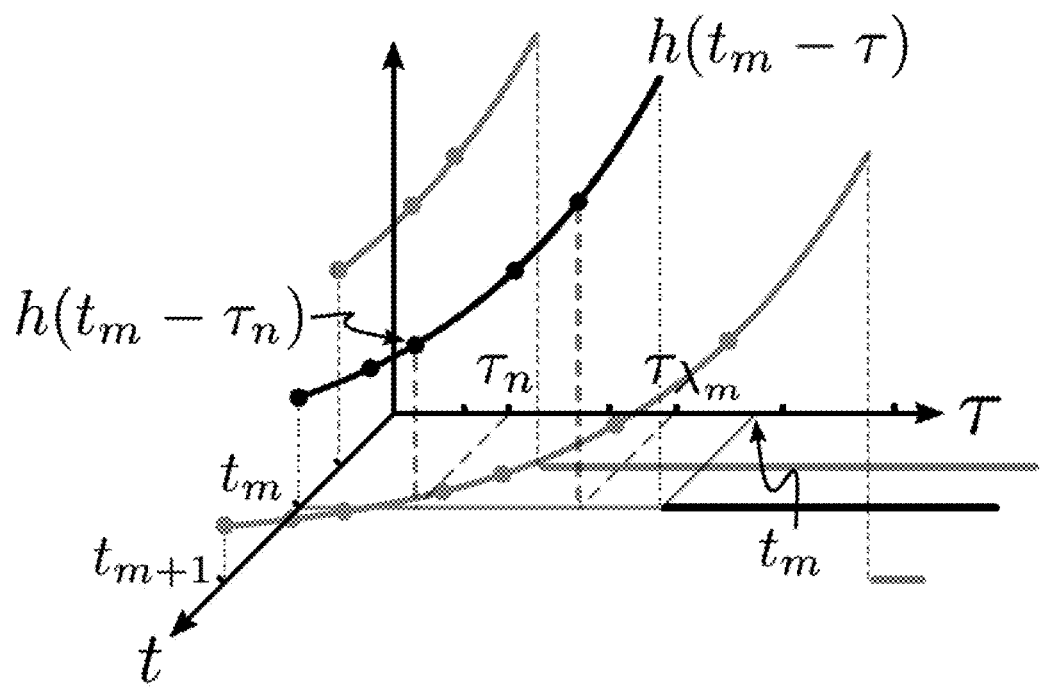

FIG. 4. Illustrates an interpretation of a non-uniform sampling rate converter by considering samples of the function h(t−τ), i.e. {h(t$_m$−τ$_n$)}, for an underlying system given by h(t)=e$^{-\alpha t}$u(t).

Figure 5:
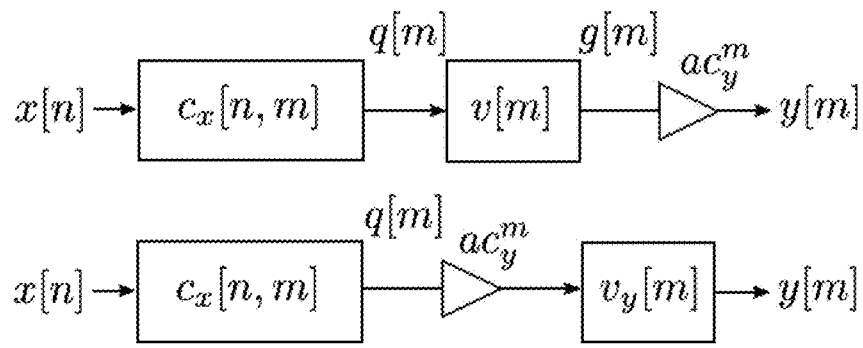

FIG. 5. Is a block-diagram representation of the time-varying filter h[n, m] for an associated continuous-time first-order system. Both systems are input-output equivalent. The interchange of the last two operations results in the bottom one having a recursive filter parametrized by cy.

Figure 6:
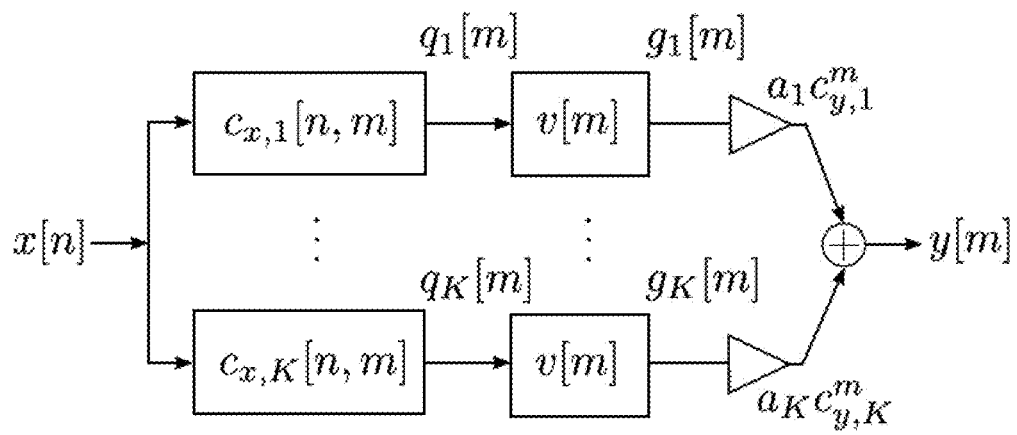

FIG. 6. Is a block-diagram representation for non-uniform sampling rate conversion where the underlying continuous-time filter consists of a linear combination of first-order systems.

Figure 7:
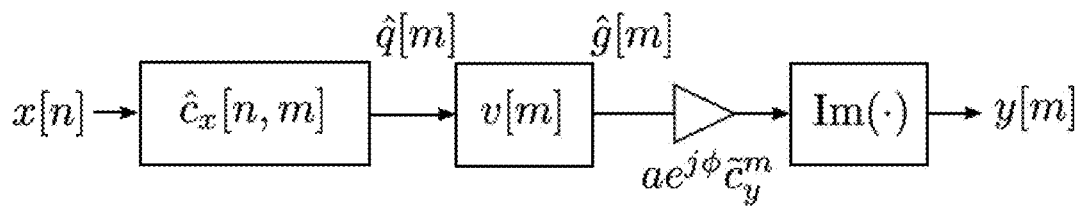

FIG. 7. Is a block-diagram representation of non-uniform sampling rate conversion for an underlying continuous-time second-order system h(t). The last block takes the imaginary part of the complex input sample.

Figure 8:
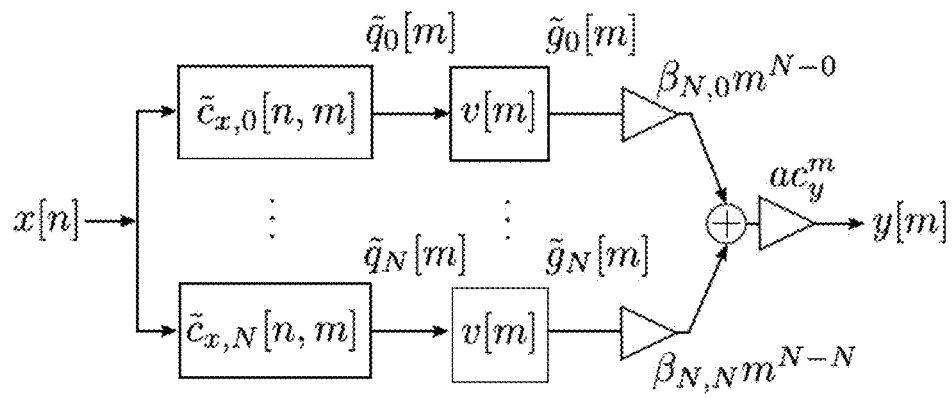

FIG. 8. Illustrates a structure for real poles with multiplicity.

Figure 9:
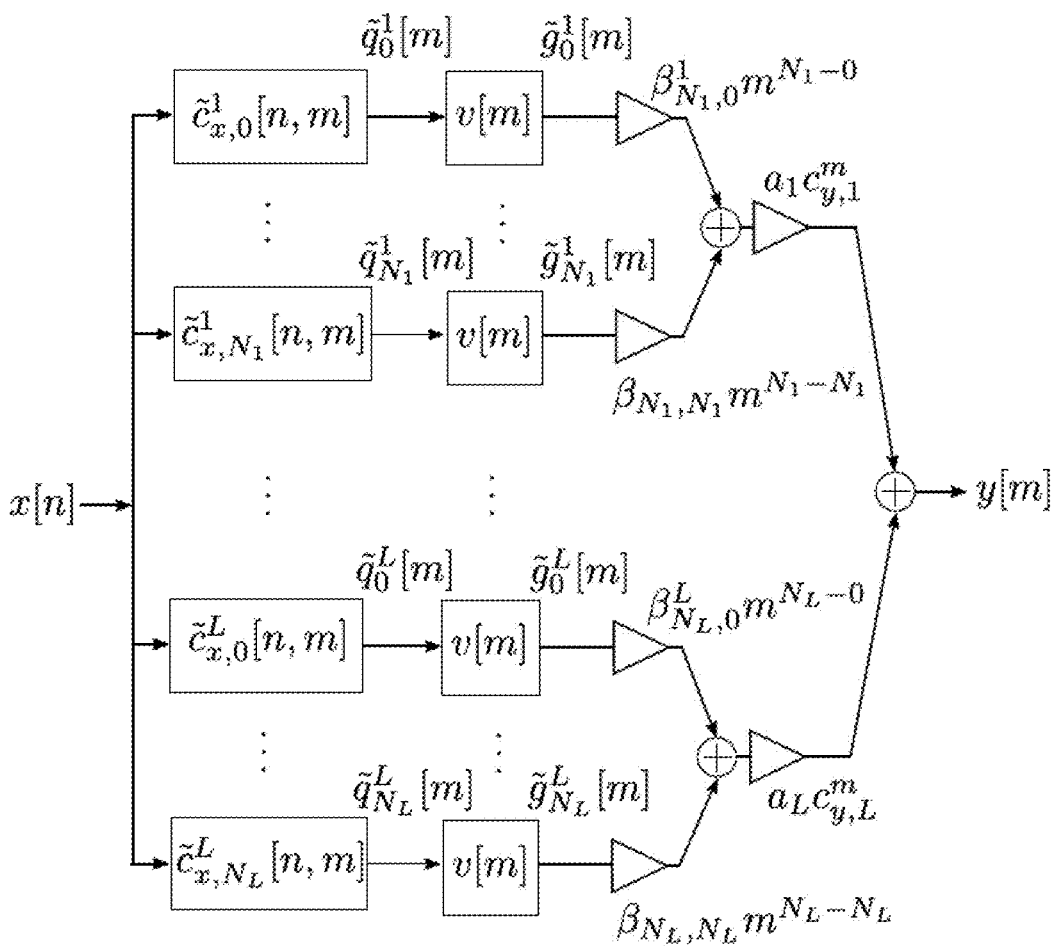

FIG. 9. Illustrates a structure for several systems with real poles with multiplicity.

While the invention is susceptible to various modifications and alternative forms, specific embodiments have been shown by way of examples in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

It should be understood that the detailed description and specific examples, while indicating embodiments of the invention, are given by way of illustration only, since various changes and modifications within the spirit and scope of the invention will become apparent to those skilled in the art from this detailed description.

In general, the present invention relates to a method enabling non-uniform sampling rate conversion of signals. In the following, the invention will primarily be described in relation to an embodiment where the method is described through block diagrams and where the converted signals may be in any suitable form such as acoustic signals, such as audio signals, such as telecommunication signals and the like.

The invention may further enable the conversion of sampling rates of signals arbitrarily while adapting to instantaneous changes in the sampling rate over time. This may be done by accommodating the processing of sequences at non-uniform input and output sampling rates in a computationally efficient manner, requiring low complexity and with low memory requirements.

Sampling rate conversion may be understood by considering the reconstruction of the discrete-time signals involved in the process. In particular, it may be possible to associate a continuous-time signal $x_c(t)$ to a given discrete-time sequence $\{x_n\}$ at time instants $\tau_n = nT_x \epsilon_{x,n}$ for some $T_x > 0$ and $\epsilon_{x,n} \in \mathbb{R}$ by assuming that $x_c(t)$ may be constructed from the non-uniform samples $\{x_n\}$ in the following manner:

$$x_c(t) = \sum_{n \in \mathbb{Z}} x_n h_r(t - \tau_n) \tag{1}$$

Figure 1:
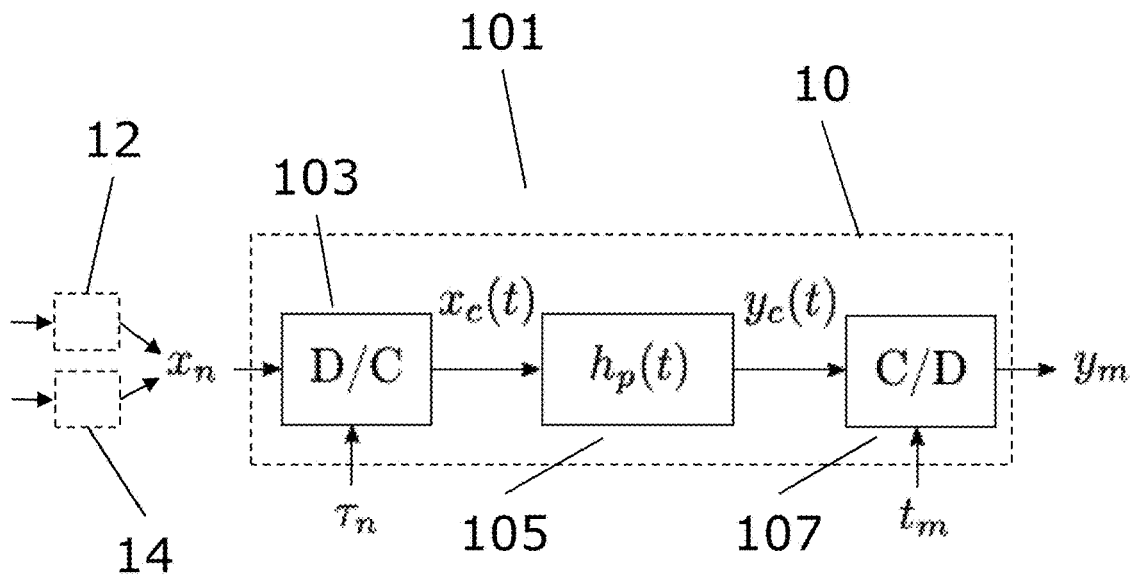
FIG. 1 illustrates a block diagram of the non-uniform sampling rate conversion illustrated as reconstruction and resampling in the continuous-time domain.

The continuous-time signal $x_c(t)$ may be resampled, in a controller 10, at time instants $t_m = mT_y \epsilon_{y,m}$ for some $T_y > 0$ and $\epsilon_{y,m} \in \mathbb{R}$, it may be desirable to perform some processing by means of a filter 105 before—e.g. in order to avoid aliasing—and sample the signal $y(t) = (x*h_p)(t)$ instead, see the block diagram 101 of FIG. 1. Then, non-uniform sampling rate conversion comprises taking the sequence $\{x_n\}$ and generating the sequence $\{y_m\}$ for general non-uniform input and output rates. In principle, this process may be carried out in the continuous-time domain by considering it as resampling after reconstruction of $x_c(t)$ from the non-uniform samples $\{x_n\}$. This may be carried out by means of a discrete-to-continuous block 103, which takes a sequence of $\{x_n\}$ as input and outputs a continuous time signal $x_c(t)$. Note that the filter 105 may be an ideal low-pass filter whose cut-off frequency satisfies the considerations about the Nyquist rate relative to $x_c(t)$, the system outputs the non-uniform samples $\{x(t_m)\}$. This process is illustrated in 105 in the block diagram 101 of FIG. 1. It may be assumed that the sampling instants form a strictly increasing sequence which is guaranteed if $$\epsilon_{,l+1} > \epsilon_{,l} \frac{l}{l+1} \tag{2}$$

for all $l \in \mathbb{Z}$.

Figure 2:
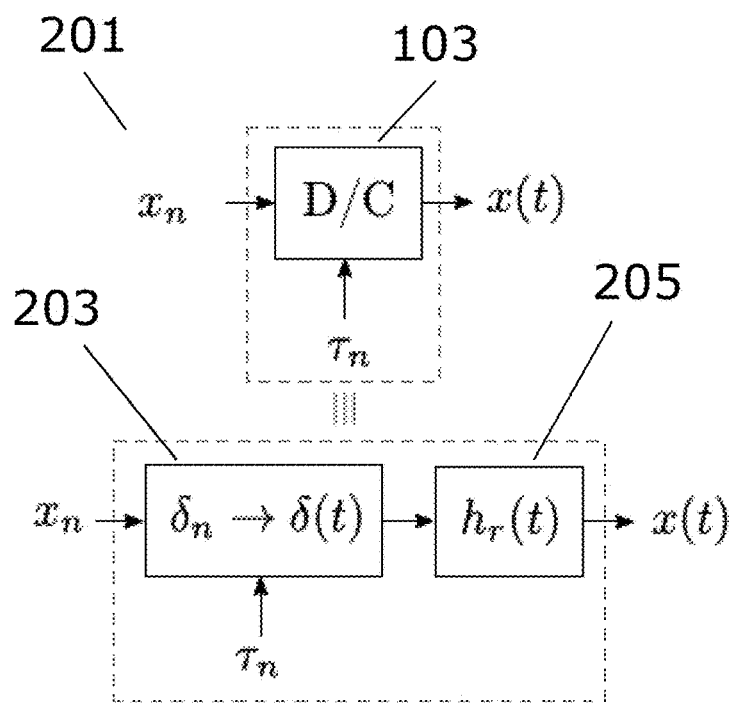
FIG. 2 illustrates a block diagram representing the discrete-to-continuous block as a sequence-to-impulses operation followed by a reconstruction filter.

The continuous-to-discrete block 107 takes a continuous-time signal $y_c(t)$ and outputs its samples $y_m = y(t_m)$. The operation of the discrete-to-continuous block 103 may be further split into two parts. FIG. 2 shows its two components in the block diagram of 201. The first block 203 converts the sequence to an impulse train, i.e. it outputs the continuous-time signal $x_n\delta(t-\tau_n)$. The resulting signal is then passed through a reconstruction filter 205. It may be possible to combine the reconstruction filter 205 and the filter 105 into a single filter $h(t)=(h_r*h_p)(t)$ (herein after denoted as $h(\bullet)$). Then, the signal to be resampled after reconstruction $y_c(t)=\Sigma x_n h(t-\tau_n)$ may generate the samples $$y_m = \sum_{n\in\mathbb{Z}} x_n h(t_m - \tau_n) \tag{3}$$

Figure 3:
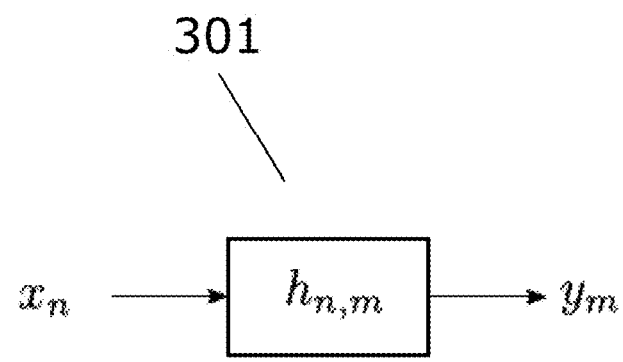
FIG. 3 illustrates a block diagram for time-varying discrete-time system for non-uniform sampling rate conversion.

From (3), it may be seen that the entire conversion process may be carried out in the discrete-time domain by considering $h_{n,m}=h(t_m-\tau_n)$ as a time-variant discrete-time system, see the block diagram 301 of FIG. 3.

Note that the coefficients $h_{n,m}$ correspond to non-uniform samples of $h(\bullet)$. In the next sections, it will be shown how the computation of this samples may be done efficiently with low memory and computational requirements when $h(\bullet)$ comprises a linear combination of exponentials. Such filters may for instance be Infinite Impulse Response (IIR) filters. An IIR filter may comprise a plurality of filter types such as a Butterworth filter, such as a Chebyshev filter, such as an Elliptic filter (also known as a Cauer filter), such as a Bessel filter.

Uniform sampling rate conversion may be seen as a particular case of the non-uniform case, i.e. $\epsilon_{x,n}=\epsilon_{y,m}=1$ for all $n, m \in \mathbb{Z}$. In this setting, the reconstruction filter may be considered as an ideal filter performing bandlimited interpolation given by $h_r(t)=\text{sinc}(t/T_x)$. Then, $h_p(t)$ may be taken as an antialiasing filter appropriately chosen according to the new sampling rate. Therefore, it may be common in practice to choose the filter $h(t)=(h_r*h_p)(t)$ as a causal filter approximating an ideal one with cut-off frequency $\min\{\pi/T_x, \pi/T_y\}$ rad/s. The uniform samples of the signal $y_c(t)$, denoted by $y[m]=y(mT_y)$, may then be written as $$y[m] = \sum_{n\in\mathbb{Z}} x[n] h(mT_y - nT_x) \tag{4}$$

for $m\in\mathbb{Z}$ where $x[n]$ may be the uniform input sequence. The conversion process may also be carried out in the continuous-time domain. Equivalently, it may be performed in the discrete-time domain by considering the time-varying filter $h[n, m]=h(mT_y-nT_x)$. The discrete-time approach may be in general preferable. One of the advantages of the resampling after reconstruction approach in the continuous-time domain may be that it does not make any assumption whatsoever of the relationship between the two sampling rates, i.e. the framework may be valid for any two arbitrary sampling rates.

Similarly to the non-uniform case, each output sample may require knowledge of the samples of the impulse response $\{h(mT_y-nT_x)\}_{n\in\mathbb{Z}}$. This set of samples may, in principle, be different for each output sample and for changes in $T_x$ or $T_y$ when considering non-uniform rates. It is shown that the present invention may compute efficiently, in a recursive manner, and with low memory requirements this new set of samples for each output sampling rate and for instantaneous changes in the sampling rates.

The key aspect of this embodiment is to make non-uniform sampling rate conversion efficient based on a useful decomposition of the impulse response $h(\bullet)$. In particular, the approach of the present embodiment may be based on the observation that filters of interest used in practice may be separated in the following manner:

$$h(t-\tau)=h_1(t)h_2(\tau)u(t-\tau) \tag{5}$$

where $u(\bullet)$ is defined as $u(t)=0$ for $t<0$ and $u(t)=1$ for $t\geq 0$. This separation property satisfied by the impulse response may enable to express the output signal as $$y_m = h_1(t_m)\sum_{n\geq 0} x_n h_2(\tau_n)u(t_m-\tau_n) \tag{6}$$

where it may be assumed that the input signal may be causal, i.e. $x_n=0$ for $n\geq 0$. It should be noted that the summation may be finite since $u(t_m-\tau_n)\neq 0$ only for $t_m>\tau_n$. Equivalently, it may be further denoted that $$\lambda_{m,n} := \left\lfloor m\frac{T_y \epsilon_{y,m}}{T_x \epsilon_{x,n}} \right\rfloor \tag{7}$$

where $\lfloor\bullet\rfloor$ may denote the floor function. Thus, the summation comprises the values of n such that $0\leq n\leq\lambda_{m,n}$. It may be clear that there may always exist some integer value $\lambda_m$ such that $$\{n\in\mathbb{Z}: 0\leq n\leq\lambda_{m,n}\}=\{n\in\mathbb{Z}: n=0,\ldots\lambda_m\} \tag{8}$$

Then, it may be possible to write $$y_m = h_1(t_m)\sum_{n=0}^{\lambda_m} x_n h_2(\tau_n) \tag{9}$$

The complexity in this expression may reduce to computing the values at the corresponding non-uniform instants of both factors of $h(\bullet)$. This factorization may allow separating the output sampling instants into the factor $h_1(t_m)$ and a second factor comprising a summation whose terms may solely depend on the input sampling instants and where the number of terms may be given by a relationship between input and output sampling instants. It will be shown below how this calculation may be done recursively with the added complexity of an exponentiation whenever the corresponding $\epsilon_{\bullet,l}$ are not constant.

An example of a relevant class of filters is filters described by linear-constant coefficient differential equations. The particular structure of the impulse response of a linear combination of exponentials may be amenable to computing recursively the filter coefficients and adapting to instantaneous changes in the input and output sampling rates. The general form for an N-th order equation may be given by $$\sum_{k=0}^{N} a_k y^{(k)}(t) = \sum_{l=0}^{M} b_l x^{(l)}(t) \tag{10}$$

Under certain assumptions, this equation may be interpreted as describing a system with input $x_c(t)$ and output $y_c(t)$. In particular, assuming initial rest—i.e. if $x_c(t)=0$ for $t\leq t_o$, then $y_c(t)=0$ for $t\leq t_o$—the input-output relationship may correspond to a causal Linear Time-Invariant (LTI) system.

Continuous-time linear filters may usually be described in this manner and analysed in the Laplace transform domain. In particular, they may yield rational transfer functions of the form $$H(s) = \frac{Y(s)}{X(s)} = A\frac{\prod_{k=1}^{M}(s-z_k)}{\prod_{k=1}^{N}(s-p_k)} \quad (11)$$

for $A \in \mathbb{C}$

If we assume that the poles are distinct and that N>M, it may be shown by partial fraction expansion that the inverse Laplace transform may correspond to an impulse response of the form $$h(t) = \sum_{k=1}^{N} a_k e^{\alpha_k t} u(t) = \sum_{k=1}^{N} h_k(t) \quad (12)$$

where $\alpha_k \in \mathbb{C}$. Due to the linearity property of the convolution, the output of such a system may be the sum of the outputs for each of the systems $h_k(\bullet)$. This may allow performing the convolution in a parallel manner.

In order to illustrate how the computation may be arranged, filter (12) may be taken as an example for one of its components $h_k(t)=a_k e^{\alpha_v k t} u(t)$. The output of this signal path of the sampling rate converter may be then be expressed as $$y_m^k = a_k \left(e^{\alpha_k T_y \epsilon_{y,m}}\right)^m \sum_{n=0}^{\lambda_m} x_n \left(e^{-\alpha_k T_x \epsilon_{x,n}}\right)^n \quad (13)$$

Where $\epsilon_{x,n}$ and $\epsilon_{y,m}$ are seen as deviations from a fixed frequency of the input signal, $T_x$, and the output signal, $T_y$, respectively.

If it is assumed that $\epsilon_{x,n}=\epsilon_{y,m}=1$, it may be straightforward to see how the factor $(e^{\alpha_k T_y})^m=(e^{\alpha_k T_y})^{m-1}(e^{\alpha_k T_y})$ may be recursively computed for each output sample from the value in the previous time step. The same applies to the coefficients $(e^{\alpha_k T_x})^n$. However, one of the key benefits of designing a sampling rate converter in this way may be the ability to accommodate non-uniform input and output sampling instants—i.e. adapt to instantaneous changes in the sampling rates—with low computational requirements. These changes may require a computation of the factors $(e^{\alpha_k T_y \epsilon_{y,m}})^m$ and $(e^{-\alpha_k T_x \epsilon_{x,n}})^n$ where the number of terms in the summation may also be updated.

The update of the coefficients in both cases may be carried out in the same manner. Taking the coefficients corresponding to the output sampling rate between time step m−1 and m as an example, and assuming that at this point the value $(e^{\alpha_k T_y})^{m-1}$ and $e^{\alpha_k T_y}$ are kept in memory. Thus, in order to compute $(e^{\alpha_k T_y \epsilon_{y,m}})^m$, the following may be written $$(e^{\alpha_k T_y \epsilon_{y,m}})^m = (e^{\alpha_k T_y m})^{\epsilon_{y,m}} = (e^{\alpha_k T_y} e^{\alpha_k T_y (m-1)})^{\epsilon_{y,m}} \quad (14)$$

Thus, this calculation may firstly require the computation of $(e^{\alpha_k T_y})^m$ which may be done recursively followed by the operation of raising this value to the power of $\epsilon_{y,m}$. The same applies to the coefficients $(e^{\alpha_k T_x \epsilon_{x,n}})^n$. The added computational complexity on top of the recursion reduces to performing this exponentiation. Another possibility if the non-uniform time instants are given by T+ε may be to compute instead, in addition to $(e^{\alpha_k T_y})^m$, the value $e^{\alpha_k \epsilon m}$. This may be, in principle, less computationally efficient as m grows larger. In this case, the computation may be reduced by using the principle of addition-chain exponentiation.

Certain non-uniform input and output sampling instants are particularly amenable to efficient computation. In order to introduce this, note first that the summation in (9) can be computed recursively since for the output sample $y_m$, we can use the result of the summation calculated to compute $y_{m-1}$. Note that, for each m, there exists some $n_m$ such that $n_m \leq \lambda_{m,n_m}$ and $1+n_m > \lambda_{m,1+n_m}$. Thus, the additional number of terms in the summation for each output sample m is given by $$M_m := \lambda_{m,n_m} - \lambda_{m-1,n_{m-1}}. \quad (15)$$

In order to illustrate this recursion, consider the function $h(t-\tau)$. We can interpret (1) as a linear combination of its sampled versions along both time axis, each one corresponding to the input or output time variables. FIG. 4 depicts this function for the system in (13) with $\alpha_k<0$. It shows that, for each m, we have samples of the function $h(t_m-\tau)$ at the instants $\{\tau_n\}_{\tau_n \leq t_m}$. However, due to the separation property, we can arrange the computation as in (9). Thus, the summation performed to obtain $y_{m-1}$ can be reused by adding the terms $x_n h_2(\tau_n)$ corresponding to $t_m-1<\tau_n\leq t_m$. In other words, the number of terms to compute this recursion depends on how many input sampling instants fall between two consecutive output sampling instants. This number is precisely $M_m$ which can be equivalently expressed as $M_m=|\mathfrak{T}_m|$ where $\mathfrak{T}_m=\{\tau_n : t_m-1<\tau_n\leq t_m\}$. Then, it can be shown that $M_m$ may be relatively small depending on the input and output sampling instants.

We can illustrate this more formally by taking as an example uniform input and output sampling rates. Let us first decompose the ratio of sampling rates as $$\frac{T_y}{T_x} = l + r \quad (16)$$

where l is a nonnegative integer and $0 \leq r < 1$. Then, the additional number of terms in the summation reduces to $$\begin{aligned}M_n &= \lambda_m - \lambda_{m-1} \\ &= l + \lfloor mr \rfloor - \lfloor (m-1)r \rfloor \\ &= l + \Delta_m\end{aligned} \quad (17)$$

where $\Delta_m$ is binary valued, i.e. $\Delta_m \in \{0,1\}$. Note that if $T_y<T_x$, then l=0 and depending on the index m, $\Delta_m$ determines if there is an additional term in the summation or not. In other words, when the output rate is faster than the input rate, there is only need to compute at most one term in the summation. Similarly, when both sampling rates are close, we may also have l=1 which reduces the number of terms in the summation significantly.

A particular case involving non-uniform samples that may be specially amenable to efficient computation corresponds to uniform input rate and non-uniform output rate. In practice, this situation can arise when two systems with different clocks operating at uniform nominal rates are interconnected. Then, the output rate is non-uniform relative to the input rate. In other words, the conversion ratio varies with time as a result of this drift. These output samples may then be used for further processing as discussed here or for subsequent non-uniform reconstruction.

In this scenario, the computational efficiency is based on the fact that the exponentiation is performed solely for the factor $h_1(t_m)$. We may have more coefficients to update in the summation, which are determined by $[mT_y \epsilon_{y,m}/T_x]$, that would only require multiplications without the need of exponentiations. Thus, the computational complexity of the exponentiation is only connected to the single coefficient $h_1(t_m)$. We will illustrate in detail how this computation can be arranged and show how these properties apply to different systems in the next sections.

In order to avoid cumbersome notation, we denote the non-uniform input sampling instants by $nT_x$ instead of $nT_x \epsilon_{x,n}$, similarly for the output sampling instants. The reader can assume then that $T_x$ can vary from sample to sample as presented in previous sections.

Let us first consider a first-order system with the impulse response $$h(t) = e^{-\alpha t} u(t) \tag{18}$$

with $\alpha > 0$ and Laplace transform $H(s) = 1/(s+\alpha)$ for $\mathrm{Re}(s) > -\alpha$. Then, the discrete-time varying system takes the form $$\begin{aligned} y[m] &= \sum_{n=0}^{\lambda_m} x[n] h(mT_y - nT_x) \\ &= \sum_{n=0}^{\lambda_m} x[n] e^{-\alpha(mT_y - nT_x)} \\ &= \left(e^{-\alpha T_y}\right)^m \sum_{n=0}^{\lambda_m} x[n] \left(e^{+\alpha T_x}\right)^n \\ &= c_y^m \sum_{n=0}^{\lambda_m} x[n] c_x^n \\ &= c_y^m g[m]. \end{aligned} \tag{19}$$

The constants $c_y$ and $c_x$ depend solely on the respective sampling periods $T_y$ and $T_x$. Moreover, the computation in (19) can be performed recursively, i.e.

$$g[m+1] = g[m] + q[m+1] \tag{20}$$

where the function $q[m+1]$ takes the form $$q[m+1] = \begin{cases} 0 & \lambda_m < \left\lfloor (m+1)\frac{T_y}{T_x} \right\rfloor - 1 \\ \sum_{n=\lambda_m+1}^{\left\lfloor (m+1)\frac{T_y}{T_x} \right\rfloor} x[n] c_x^n & \lambda_m \geq \left\lfloor (m+1)\frac{T_y}{T_x} \right\rfloor - 1 \end{cases}. \tag{21}$$

There are two important distinctions to be made. Note that if $T_y < T_x$, i.e. the rate of output samples is higher than the rate of input samples, there will often be cases where $q[m+1] = 0$ or if different from zero, it will at most consist of only the term $q[m+1] = x[\lambda_m + 1] c_x^{\lambda_m + 1}$. If the rate of output samples is slower than the input rate, i.e. $T_y > T_x$, then there will always be at least one term in the summation to compute $q[m+1]$ as shown in (17).

The output samples are given by $y[m] = c_y^m g[m]$ where, clearly, the factor $c_y^m$ can be recursively computed by means of one multiplication for each output sampling rate and the corresponding exponentiation for non-uniform output sampling instants as described in the previous section. The intermediate sample values $g[m]$ can be also be computed recursively as $g[m] = g[m-1] + q[m]$, where $q[m]$ is given by (21). Note again that the coefficients $c_x^n$ to generate $q[m]$ can be recursively computed and the number of coefficients needed for each output time step, i.e. $M_m$, depends on the sample instants and the ratio $T_y/T_x$. Similarly, the coefficients $c_x^n$ to compute $q[m]$ can be computed recursively with the corresponding exponentiations for non-uniform input sampling instants.

We can denote the input-output relationship in (20) by $c_x[n,m]$. Note again that if $T_y < T_x$ there will be instants at which $q[m] = 0$ or, in other words $g[m] = g[m-1]$, thus no computations whatsoever are made to compute $g[m]$. If we consider uniform input and output sequences, we can compute $g[m]$ recursively using $q[m]$ as the input to a linear time-invariant system with z-transform $V(z) = 1/1 - z^{-1}$ (see FIG. 5). The output in this case is computed by at most one addition whenever $q[m] \neq 0$. Alternatively, the computation can also be rearranged in the way shown at the bottom of FIG. 5, i.e.

$$\begin{aligned} y[m] &= c_y^m (g[m-1] + q[m]) \\ &= c_y c_y^{m-1} g[m-1] + c_y^m q[m] \\ &= c_y y[m-1] + c_y^m q[m]. \end{aligned} \tag{22}$$

Thus, for an input $c_y^m q[m]$, we can express $y[m]$ as the output of a linear time-invariant system $v_y[m]$ with z-transform $V_y(z) = 1/(1 - c_y z - 1)$. However, the ordering of operations represented by the top block diagram in FIG. 5 is more convenient whenever we have instantaneous changes in the sampling rates since the parameters of $v[m]$ are independent of changes in $T_y$.

We can generalize the system of the previous section to an impulse response formed by K first-order systems which can be considered as a parallel structure. In particular, we have that $$h(t) = u(t) \sum_{k=1}^{K} a_k e^{-\alpha_k t} \tag{23}$$

for $a_k > 0$ and $a_k \in \mathbb{R}$.

In this case, the output $y[m]$ will then be given by $$\begin{aligned} y[m] &= \sum_{n=0}^{\lambda_m} x[n] \sum_{k=1}^{K} a_k e^{-\alpha_k mT_y} e^{+\alpha_k nT_x} \\ &= \sum_{k=1}^{K} a_k \left(e^{-\alpha_k T_y}\right)^m \sum_{n=0}^{\lambda_m} x[n] \left(e^{+\alpha_k T_x}\right)^n \\ &= \sum_{k=1}^{K} a_k c_{y,k}^m \sum_{n=0}^{\lambda_m} x[n] c_{x,k}^n = \sum_{k=1}^{K} a_k c_{y,k}^m g_k[m]. \end{aligned} \tag{24}$$

The same principles with regard to operations described before extend to this case equally. Again, if the input and output sequences are non-uniform, we would have to take into account the corresponding exponentiation required to update the respective coefficients. FIG. 6 shows the parallel implementation of a non-uniform sampling rate converter when the underlying continuous-time filter is given by (23).

In order to provide an idea of the computational demands of this algorithm, we can consider the number of additions, multiplications, the appropriate complexity that the exponentiation step adds, and the memory requirements. We will focus on the operations needed to generate one output sample.

Thus, for a single first-order system and uniform sequences, we first have to keep in memory a, $c_y$, $c_y^{m-1}$, $c_x$, $c_x^{\lambda_{m-1}}$, and g[m−1]. In order to compute g[m] we need $1_{M_m \geq 1}(M_m)$ additions—since there are $M_m = 1 + \Delta_m$ terms in the residual summation and v[m] only requires one addition—and $2M_m = 2(1 + \Delta_m)$ multiplications. Then, we need one multiplication to update the factor $c_y^m$ and two multiplications to obtain $y[m] = ac_y^m g[m]$. Note that we have separated the factor a from $c_y$ since in the case of non-uniform output rates this leads to a more efficient exponentiation as shown in (14). This gives us a total of $2(M_m + 1) + 1$ multiplications per output sample.

If the output rate is uniform, the corresponding constant a do not add computational complexity for the computation of $ac_y^m$ since we can assume the values $ac_y^{m-1}$ and $c_y$ are kept in memory instead.

If we have non-uniform input or output sequences, the added complexity relies on performing the corresponding exponentiations whenever the sampling instants do not fall into a uniform grid. In particular, let us denote the number of exponentiations corresponding to the coefficients $\{c_x^n\}$ as $$E_m := \sum_{n=\lambda_{m-1}+1}^{\lambda_m} 1_{\epsilon_{x,n} \neq 1}(\epsilon_{x,n}) \quad (25)$$

which, obviously, satisfies that $E_m \leq M_m$. We may also have to perform one exponentiation for $(e^{\alpha_k T_y \epsilon_{y,m}})^m$ as shown in (14), and $E_m$ exponentiations for the respective coefficients of the form $(e^{\alpha_k T_x \epsilon_{x,n}})^n$. This amounts to $E_m + 1_{\epsilon_{y,m} \neq 1}(\epsilon_{y,m})$ real exponentiations per output sample.

The same principle of separation of variables is satisfied by an impulse response that takes the following form $$h(t) = e^{-\alpha t} e^{j\omega_0 t} u(t) \quad (26)$$

where $\alpha > 0$ and $\omega_0 \in \mathbb{R}$. The operations can be rearranged by following the same principle shown in (19), i.e.

$$y[m] = \sum_{n=0}^{\lambda_m} x[n] e^{-\alpha(mT_y - nT_x)} e^{j\omega_0(mT_y - nT_x)} \quad (27)$$

$$= \left(e^{-\alpha T_y + j\omega_0 T_y}\right)^m \sum_{n=0}^{\lambda_m} x[n] \left(e^{+\alpha T_x - j\omega_0 T_x}\right)^n$$

$$= \hat{c}_y^m \sum_{n=0}^{\lambda_m} x[n] \hat{c}_x^n = \hat{c}_y^m g[m]$$

where the constants $\hat{c}_y$ and $\hat{c}_x$ can be precomputed or updated if there are changes in the sampling rates similarly to the description of first-order systems.

We are interested in the case of real second-order systems that are causal and stable. These systems have an impulse response that can be expressed as $$h(t) = ae^{-\alpha t} \sin(\omega t + \phi) u(t) \quad (28)$$

for a, ω and $\phi \in R$ and $\alpha > 0$. In this case, the associated computation to obtain the output samples y[m] can be carried out by rearranging the operations in a manner similar to the preceding, namely $$y[m] = \frac{a}{2j} \left(e^{-\alpha T_y}\right)^m \left[e^{+j\phi} \left(e^{+j\omega T_y}\right)^m \sum_{n=0}^{\lambda_m} x[n] \left(e^{+\alpha T_x - j\omega T_x}\right)^n - e^{-j\phi} \left(e^{-j\omega T_y}\right)^m \sum_{n=0}^{\lambda_m} x[n] \left(e^{+\alpha T_x + j\omega T_x}\right)^n\right] \quad (29)$$

$$= \frac{a}{2j} c_y^m \left[e^{+j\phi} \tilde{c}_y^m \sum_{n=0}^{\lambda_m} x[n] \hat{c}_x^n - e^{-j\phi} (\tilde{c}_y^*)^m \sum_{n=0}^{\lambda_m} x[n] (\hat{c}_x^*)^n\right]$$

$$= \frac{a}{2j} c_y^m \left[e^{+j\phi} \hat{c}_y^m \hat{g}[m] - \left(e^{+j\phi} \hat{c}_y^m \hat{g}[m]\right)^*\right]$$

$$= \text{Im}\left(ae^{+j\phi} \hat{c}_y^m \hat{g}[m]\right)$$

where $\tilde{c}_y = e^{-j\omega T_y}$, $\hat{c}_x = e^{(\alpha T_x - j\omega T_x)}$, and $\hat{c}_y = c_y \tilde{c}_y$. FIG. 7 shows a block-diagram representation of the non-uniform sampling rate converter when h(t) is a second-order system. The operations involved are very similar to the first-order case (see FIG. 5) with the added number of real multiplications—now the coefficients are complex numbers—and the computationally inexpensive operation of keeping solely the imaginary part to generate the appropriate output sample.

If we have a sum of second-order systems such as $h(t) = u(t) \Sigma_{k=1}^{K} a_k e^{-\alpha_k t} \sin(\omega_k t + \phi_k)$, the generalized structure is constructed similarly to the case of first-order systems consisting of K parallel systems as in FIG. 7 with the respective coefficients.

We have to keep in memory the complex values $ae^{+j\phi}$, $\hat{c}_y$, $\hat{c}_y^{m-1}$, $\hat{c}_x$, $\hat{c}_x^{m-1}$, and $\hat{g}[m-1]$.

Evidently, we assume that the input x[n] is a real signal. The factor $\hat{c}_y^m$ can be computed recursively with four real multiplications and two additions. Similarly to the situation of first-order systems, we separate the factor $ae^{+j\phi}$ to perform the exponentiation more efficiently as in (14) if required. The term $\hat{g}[m]$ can also be computed recursively by using $\hat{g}[m-1]$. This requires the calculation of $M_m$ coefficients of the form $\hat{c}_x$ that can also be computed recursively with four multiplications and two additions per coefficient. This amounts to $6M_m = 6(1 + \Delta_m)$ real multiplications and $2M_m + 21_{M_m \geq 1}(M_m)$ additions in order to obtain $\hat{g}[m]$. As a result, we have a total of $6(M_m + 1) + 4$ real multiplications—since we are only interested in the imaginary part—and $2M_m + 21_{M_m \geq 1}(M_m) + 3$ additions per output sample.

If the input or output rate is always uniform, we could in principle combine the constant factor $ae^{j\phi}$ into $\hat{c}_y$ or $\hat{c}_x$—depending on what rate is uniform—resulting in a slight reduction of memory and computational requirements. If we have non-uniform input and output sequences, updating the coefficients requires the corresponding exponentiations whenever the sampling instants do not fall into a uniform grid. Thus, using the notation in (25), this would require $E_m + 1_{\epsilon_{y,m} \neq 1}(\epsilon_{y,m})$ complex exponentiations.

We can also consider a system whose Laplace transform consists of repeated poles on the real axis. Transfer functions with repeated poles—real or in complex conjugate pairs—rarely appears in practice. However, we include the development here for illustrative purposes and to show how the separation property, described in (5), can be used to arrange the computation in other systems. In principle, a similar approach can be applied to the case of repeated pairs of complex conjugate pairs. The impulse response in the case of real poles with multiplicity can then be expressed in the following manner $$h(t) = at^N e^{-\alpha t} u(t) \quad (30)$$

for $\alpha > 0$, $N \geq 0$, and $a \in \mathbb{R}$.

Similarly to previous sections, we can then write the output of the discrete-time sampling rate converter as $$y[m] = a \sum_{n=0}^{\lambda_m} x[n](mT_y - nT_x)^N \left(e^{-\alpha T_y}\right)^m \left(e^{+\alpha T_x}\right)^n \quad (31)$$

$$= ac_y^m \sum_{n=0}^{\lambda_m} x[n] c_x^n \sum_{k=0}^{N} \binom{N}{k} (mT_y)^{N-k} (-nT_x)^k$$

$$= ac_y^m \sum_{k=0}^{N} \binom{N}{k} T_y^{N-k} m^{N-k} \sum_{n=0}^{\lambda_m} x[n] c_x^n (-nT_x)^k.$$

If the input and output sequences are uniform, the computation can be arranged as $$y[m] = ac_y^m \sum_{k=0}^{N} \binom{N}{k} T_y^{N-k} T_x^k m^{N-k} \sum_{n=0}^{\lambda_m} x[n] c_x^n (-n)^k. \quad (32)$$

By denoting the values $$\beta_{N,k} = \binom{N}{k} T_y^{N-k} (-T_x)^k,$$

which can be precomputed and stored in memory, we can write the output as $$y[m] = ac_y^m \sum_{k=0}^{N} \beta_{N,k} m^{N-k} \tilde{g}_k[m] \quad (33)$$

where $\tilde{g}_k[m]$ can be recursively computed as $\tilde{g}_k[m+1] = \tilde{g}_k[m] + \tilde{q}_k[m+1]$. The definition of $\tilde{q}_k[m]$ is analogous to (21) with the added factor $n^k$. As shown before, the number of terms involve in the summation involved in $\tilde{q}_k[m]$ depends on the ratio $T_y/T_x$. This ordering of the computation gives us the structure shown in FIG. 8.

Notice that if the multiplicity corresponds to N=0, the system in FIG. 8 reduces to the one shown in FIG. 5 and, obviously, all the considerations developed in that case applied equally to this case.

If the input and output sequences are non-uniform, we need to introduce different definitions. In particular, we need to substitute $\beta_{N,k}$ by $$\tilde{\beta}_{N,k,m} = \binom{N}{k} (T_y \epsilon_{y,m})^{N-k} \quad (34)$$

which explicitly depends on the corresponding output sampling instant. Consequently, the term $\tilde{g}[m]$ takes the form $$\tilde{g}_k[m] = \sum_{n=0}^{\lambda_m} x_n c_x^n (-nT_x \epsilon_{x,n})^k. \quad (35)$$

It is possible to generalize the previous case in a straightforward way to systems with an impulse response of the form $$h(t) = \sum_{i=1}^{L} a_i t^{N_i} e^{-\alpha_i t} u(t). \quad (36)$$

In this case, we can write $$y[m] = \sum_{i=1}^{L} a_i c_{y,i}^m \sum_{k=0}^{N_i} \beta_{N,k}^i m^{N_i-k} \tilde{g}_k^i[m]. \quad (37)$$

The structure can be readily combined in the manner shown in FIG. 9.

In this case, irrespective of having uniform or non-uniform sequences, it is required at some stage to compute powers of the form $a^v$ for some $a \in \mathbb{R}$ and a positive integer v. The naive approach would require v−1 multiplications. However, this can be further reduced by resorting to addition-chain exponentiation. Here, we take the worst-case scenario by considering this naive approach.

Consider the system with impulse response shown in (30). In order to generate one output sample y[m], we first need to store the (N+1) coefficients $\{\beta_{N,k}\}_{k=0}^{N}$ as well as a, $c_y$, $c_y^{m-1}$, $c_x$, and $c_x^{\lambda_m-1}$. Likewise first- and second-order systems, keeping in memory these last four factors makes the computation more efficient for non-uniform sequences.

In order to compute $\tilde{g}_k[m]$ we need $1_{M_m \geq 2} \cdot (M_m-1)+1$ additions and $2M_m$ multiplications. For each output sample, we also have to compute $\{m^k\}_{k=0}^{N}$ and $\{n^k\}_{k=0}^{N}$ for $n=1+\lambda_{m-1}, \ldots, \lambda_m$ which requires $(M_m+1)N(N-1)/2$ multiplications. Before combining all the channels (see FIG. 8), we need to multiply by the corresponding factors $\beta_{N,k} m^{N-k}$ which results in 2N+1 multiplications.

The result of each channel is added together by means of N additions to generate an output sample. Thus, the computations per output sample reduce to $1_{M_m \geq 2} \cdot (M_m-1)+1+N$ additions and $(M_m+1)N(N-1)/2+2M_m+2N+1$ multiplications. Note that we do not count as multiplications raising a number to zero or one, or multiplying by unity. The added complexity regarding non-uniform input or output sequences lies in updating the coefficients $\tilde{\beta}_{N,k,m}$, which requires N(N−1)/2+(N−1) multiplications, and the corresponding exponentiations to update $c_x^n$ and $c_y^m$.

If our system can be expressed as the sum of L>0 distinct systems of the form shown in (30), the computational complexity is simply increased by a factor L.

As mentioned in relation to FIG. 1, the x values may be formed as the output from an A/D converter 12 fed an analog signal.

Also, in one embodiment, the signal input comprises an element 14 configured to receive data packets and derive from each data packet, a value x(tau) and a point in time, tau.

The invention claimed is:

1. A method for converting an input signal to an output signal wherein the input signal has an input signal sampling rate that is non-uniform, the input signal representing, at each of a plurality of first points in time, τ, a first value x(τ), such that the input signal includes a plurality of first values $x(\tau_0)$ to $x(\tau_n)$ corresponding to separate, respective first points in time, $\tau_0$ to $\tau_n$, wherein n is a nonzero integer, the output signal representing, at each of a plurality of second points in time, t, a second value y(t), such that the output signal represents a plurality of second values y($t_0$) to y($t_m$) corresponding to separate respective second points in time $t_0$ to $t_m$, wherein m is a nonzero integer, the method comprising:
generating the output signal responsive to the input signal using a controller comprising at least one of a microprocessor, a digital signal processor (DSP), or a field-programmable gate array (FPGA), the plurality of second values y($t_0$) to y($t_m$) based on, for each given second point in time $t_m$, determining a corresponding second value y($t_m$) based on the controller executing a computer program stored in a storage device to execute the following Equation (1) that is stored in the storage device:

$$y(t_m) = h_1(t_m) \Sigma_{n=0}^{n=\lambda_m} x(\tau_n) * h_2(\tau_n) \quad (1)$$

wherein, in Equation (1),
$h_1(t_m)$ is a first factor that is calculated as a first exponential depending on the second point in time $t_m$ but not depending on any of the first points in time $\tau_0$ to $\tau_n$ based on the controller executing the computer program stored in the storage device, $h_2(\tau_n)$ is a second factor that is calculated as a second exponential depending on the first point in time $\tau_n$ but not depending on any of the second points in time $t_0$ to $t_m$ based on the controller executing the computer program stored in the storage device, and $\lambda_m$ is calculated based on the controller executing the computer program stored in the storage device to execute the following Equation (2) that is stored in the storage device:

$$\lambda_m = \left\lfloor m \frac{T_y \, \epsilon_{y,m}}{T_x \, \epsilon_{x,n}} \right\rfloor \quad (2)$$

wherein, in Equation (2),
$T_x$ is a constant that is stored in the storage device,
$T_y$ is another constant that is stored in the storage device,
$\epsilon_{x,n}$ is calculated based on the controller executing the computer program stored in the storage device to execute the following Equation (3) that is stored in the storage device:

$$\epsilon_{x,n} = \frac{\tau_n}{nT_x}, \quad (3)$$

and
$\epsilon_{y,m}$ is calculated based on the controller executing the computer program stored in the storage device to execute the following Equation (4) that is stored in the storage device:

$$\epsilon_{y,m} = \frac{t_m}{mT_y}. \quad (4)$$

2. The method according to claim 1, wherein the input signal represents the first value x($\tau$) where not all points in time $\tau$ are equidistant in time.

3. The method according to claim 2, wherein the input signal represents the first value x($\tau$) where x($\tau$1), x($\tau$2), x($\tau$3) and x($\tau$4) exist, where $\tau$1 and $\tau$2 are neighbouring and $\tau$3 and $\tau$4 are neighbouring, and where $|\tau 2 - \tau 1| > 1.001 * (|\tau 4 - \tau 3|)$.

4. The method according to claim 1, wherein, for each first point in time, the second factor is calculated.

5. The method according to claim 1, wherein, for each second point in time not being identical to a first point in time, the second factor is not calculated.

6. The method according to claim 1, wherein the first factor is calculated for each second point in time.

7. The method according to claim 1, wherein, for each first point in time not being identical to a second point in time, the first factor is not calculated.

8. The method according to claim 1, wherein, in Equation (1), $\Sigma_{n=0}^{n=\lambda_m} x(\tau_n) * h_2(\tau_n)$ is a sum of third values each corresponding to different first points in time.

9. The method according to claim 6, wherein, in Equation (1), $\Sigma_{n=0}^{n=\lambda_m} x(\tau_n) * h_2(\tau_n)$ is a sum of third values each corresponding to different first points in time, and the different first points in time are a predetermined number of latest first points in time prior to the second point in time for which the second value y($t_m$) is determined.

10. The method according to claim 1, wherein
$h_1(t_m)$ is calculated based on the controller executing the computer program stored in the storage device to execute the following Equation (5) that is stored in the storage device:

$$h_1(t_m) = a(e^{bT_y \epsilon_{y,m}})^m \quad (5)$$

wherein, in Equation (5), a is a first constant that is stored in the storage device and b is a second constant that is stored in the storage device, and $h_2(\tau_n)$ is calculated based on the controller executing the computer program stored in the storage device to execute the following Equation (6) that is stored in the storage device:

$$h_2(\tau_n) = c(e^{-bT_x \epsilon_{x,n}})^n \quad (6)$$

wherein, in Equation (6), c is a third constant that is stored in the storage device and b is the second constant that is stored in the storage device.

11. An apparatus for converting an input signal to an output signal wherein the input signal has an input signal sampling rate that is non-uniform, the apparatus comprising:
a signal input,
a signal output,
a controller including at least one of a microprocessor, a digital signal processor (DSP), or a field-programmable gate array (FPGA), the controller being configured to execute a computer program stored in a storage device to:
receive the input signal from the signal input, the input signal representing, at each of a plurality of first points in time, $\tau$, a first value x($\tau$), such that the input signal represents a plurality of first values x($\tau_0$) to x($\tau_n$) corresponding to separate, respective first points in time, $\tau_0$ to $\tau_n$, wherein n is a nonzero integer,
generate the output signal responsive to the input signal using the controller, the output signal representing, at each of a plurality of second points in time, t, a second value y(t), such that the output signal represents a plurality of second values y($t_0$) to y($t_m$) corresponding to separate respective second points in time $t_0$ to $t_m$, wherein m is a nonzero integer, and
transmit the output signal from the signal output, wherein the controller is configured to generate the plurality of second values $y(t_0)$ to $y(t_m)$ based on, for each given second point in time $t_m$ to determining a corresponding second value $y(t_m)$ based on the controller executing the computer program stored in the storage device to execute the following Equation (1) that is stored in the storage device:

$$y(t_m) = h_1(t_m) \Sigma_{n=0}^{n=\lambda_m} x(\tau_n) * h_2(\tau_n) \tag{1}$$

wherein, in Equation (1), $h_2(t_m)$ is a first factor that is calculated as a first exponential depending on the second point in time $t_m$ but not depending on any of the first points in time $\tau_0$ to $\tau_m$ based on the controller executing the computer program stored in the storage device, $h_2(\tau_n)$ is a second factor that is calculated as a second exponential depending on the first point in time $\tau_n$ but not depending on any of the second points in time $t_0$ to $t_m$ based on the controller executing the computer program stored in the storage device, and $\lambda_m$ is calculated based on the controller executing the computer program stored in the storage device to execute the following Equation (2) that is stored in the storage device:

$$\lambda_m = \left\lfloor m \frac{T_y \in_{y,m}}{T_x \in_{x,n}} \right\rfloor \tag{2}$$

wherein, in Equation (2), $T_x$ is a constant that is stored in the storage device, $T_y$ is another constant that is stored in the storage device, $\in_{x,n}$ is calculated based on the controller executing the computer program stored in the storage device to execute the following Equation (3) that is stored in the storage device:

$$\in_{x,n} = \frac{\tau_n}{nT_x}, \tag{3}$$

and $\in_{y,m}$ is calculated based on the controller executing the computer program stored in the storage device to execute the following Equation (4) that is stored in the storage device:

$$\in_{y,m} = \frac{t_m}{mT_y}. \tag{4}$$

12. The apparatus according to claim 11, wherein the signal input comprises an analogue signal input and a A/D converter.

13. The apparatus according to claim 11, wherein the signal input comprises an element configured to receive data packets and derive from each data packet, a separate first value $x(\tau)$ and a separate first point in time, $\tau$.

14. The apparatus according to claim 11, further comprising a clocking element for generating the second points in time.

15. The apparatus according to claim 11, wherein $h_1(t_m)$ is calculated based on the controller executing the computer program stored in the storage device to execute the following Equation (5) that is stored in the storage device:

$$h_1(t_m) = a(e^{bT_y \in_{y,m}})^m \tag{5}$$

wherein, in Equation (5), a is a first constant that is stored in the storage device and b is a second constant that is stored in the storage device, and $h_2(\tau_n)$ is calculated based on the controller executing the computer program stored in the storage device to execute the following Equation (6) that is stored in the storage device:

$$h_2(\tau_n) = c(e^{-bT_x \in_{x,n}})^n \tag{6}$$

wherein, in Equation (6), c is a third constant that is stored in the storage device and b is the second constant that is stored in the storage device.

16. A computer program stored on a computer-readable medium for converting an input signal to an output signal wherein the input signal has an input signal sampling rate that is non-uniform, the computer program comprising executable instructions that cause a computer which includes at least one of a microprocessor, a digital signal processor (DSP), or a field-programmable gate array (FPGA) to:

receive the input signal representing, at each of a plurality of first points in time, $\tau$, a first value $x(\tau)$, such that the input signal represents a plurality of first values $x(\tau_0)$ to $x(\tau_n)$ corresponding to separate, respective first points in time, $\tau_0$ to $\tau_n$, wherein n is a nonzero integer, generate the output signal responsive to the input signal using the computer, the output signal representing, at each of a plurality of second points in time, t, a second value $y(t)$, such that the output signal represents a plurality of second values $y(t_0)$ to $y(t_m)$ corresponding to separate respective second points in time $t_0$ to $t_m$, wherein m is a nonzero integer, and wherein the generating the output signal includes generating the plurality of second values $y(t_0)$ to $y(t_m)$ based on, for each given second point in time $t_m$, determining a corresponding second value $y(t_m)$ based on the computer executing the computer program stored on the computer-readable medium to execute the following Equation (1) that is stored on the computer-readable medium:

$$y(t_m) = h_1(t_m) \Sigma_{n=0}^{n=\lambda_m} x(\tau_n) * h_2(\tau_n) \tag{1}$$

wherein, in Equation (1), $h_1(t_m)$ is a first factor that is calculated as a first exponential depending on the second point in time $t_m$ but not depending on any of the first points in time $\tau_0$ to $\tau_n$ based on the computer executing the computer program stored on the computer-readable medium, $h_2(\tau_n)$ is a second factor that is calculated as a second exponential depending on the first point in time $\tau_n$ but not depending on any of the second points in time $t_0$ to $t_m$ based on the computer executing the computer program stored on the computer-readable medium, and $\lambda_m$ is calculated based on the computer executing the computer program stored on the computer-readable medium to execute the following Equation (2) that is stored on the computer-readable medium:

$$\lambda_m = \left\lfloor m \frac{T_y \in_{y,m}}{T_x \in_{x,n}} \right\rfloor \qquad (2)$$

wherein, in Equation (2), $T_x$ is a constant that is stored on the computer-readable medium, $T_y$ is another constant that is stored on the computer-readable medium, $\in_{x,n}$ is calculated based on the computer executing the computer program to execute the following Equation (3) that is stored on the computer-readable medium:

$$\in_{x,n} = \frac{\tau_n}{nT_x}, \qquad (3)$$

and $\in_{y,m}$ is calculated based on the computer executing the computer program to execute the following Equation (4) that is stored on the computer-readable medium:

$$\in_{y,m} = \frac{t_m}{mT_y}. \qquad (4)$$

17. The computer program according to claim 16, wherein $h_1(t_m)$ is calculated based on the computer executing the computer program to execute the following Equation (5) that is stored on the computer-readable medium:

$$h_1(t_m) = a(e^{bT_y \in_{y,m}})^m \qquad (5)$$

wherein, in Equation (5), a is a first constant that is stored on the computer-readable medium and b is a second constant that is stored on the computer-readable medium, and $h_2(\tau_n)$ is calculated based on the computer executing the computer program to execute the following Equation (6) that is stored on the computer-readable medium:

$$h_2(\tau_n) = c(e^{-bT_x \in_{x,n}})^n \qquad (6)$$

wherein, in Equation (6), c is a third constant that is stored on the computer-readable medium and b is the second constant that is stored on the computer-readable medium.

* * * * *

UNITED STATES PATENT AND TRADEMARK OFFICE
CERTIFICATE OF CORRECTION

PATENT NO. : 11,581,874 B2
APPLICATION NO. : 16/829411
DATED : February 14, 2023
INVENTOR(S) : Pablo Martinez-Nuevo It is certified that error appears in the above-identified patent and that said Letters Patent is hereby corrected as shown below:

In the Claims

Column 20 Line 43 Claim 11, should read:
11. An apparatus for converting input signal to an output signal wherein the input signal has an input signal sampling rate that is non-uniform, the apparatus comprising:
    a signal input,
    a signal output,
    a controller including at least one of a microprocessor, a digital signal processor (DSP), or a field-programmable gate array (FPGA), the controller being configured to execute a computer program stored in a storage device to:
        receive the input signal from the signal input, the input signal representing, at each of a plurality of first points in time, $\tau$, a first value $x(\tau)$, such that the input signal represents a plurality of first values $x(\tau_0)$ to $x(\tau_n)$ corresponding to separate, respective first points in time, $\tau_0$ to $\tau_n$, wherein n is a nonzero integer,
        generate the output signal responsive to the input signal using the controller, the output signal representing, at each of a plurality of second points in time, t, a second value $y(t)$, such that the output signal represents a plurality of second values $y(t_0)$ to $y(t_m)$ corresponding to separate respective second points in time $t_0$ to $t_m$, wherein m is a nonzero integer, and
        transmit the output signal from the signal output,
wherein the controller is configured to generate the plurality of second values $y(t_0)$ to $y(t_m)$ based on, for each given second point in time $t_m$, determining a corresponding second value $y(t_m)$ based on the controller executing the computer program stored in the storage device to execute the following Equation (1) that is stored in the storage device:

$$y(t_m) = h_1(t_m) \sum_{n=0}^{n=\lambda_m} x(\tau_n) * h_2(\tau_n) \tag{1}$$

wherein, in Equation (1),
    $h_1(t_m)$ is a first factor that is calculated as a first exponential depending on the second point in time $t_m$ but not depending on any of the first points in time $\tau_0$ to $\tau_n$ based on the controller executing the computer program stored in the storage device, Signed and Sealed this
Twenty-sixth Day of September, 2023

*Katherine Kelly Vidal*
*Director of the United States Patent and Trademark Office*

CERTIFICATE OF CORRECTION (continued)
U.S. Pat. No. 11,581,874 B2

$h_2(\tau_n)$ is a second factor that is calculated as a second exponential depending on the first point in time $t_m$ but not depending on any of the second points in time $t_0$ to $t_m$ based on the controller executing the computer program stored in the storage device, and $\lambda_m$ is calculated based on the controller executing the computer program stored in the storage device to execute the following Equation (2) that is stored in the storage device:

$$\lambda_m = \left\lfloor m \frac{T_y \epsilon_{y,m}}{T_x \epsilon_{x,n}} \right\rfloor \tag{2}$$

wherein, in Equation (2), $T_x$ is a constant that is stored in the storage device, $T_y$ is another constant that is stored in the storage device, $\epsilon_{x,n}$ is calculated based on the controller executing the computer program stored in the storage device to execute the following Equation (3) that is stored in the storage device:

$$\epsilon_{x,n} = \frac{\tau_n}{nT_x}, \tag{3}$$

and $\epsilon_{y,m}$ is calculated based on the controller executing the computer program stored in the storage device to execute the following Equation (4) that is stored in the storage device:

$$\epsilon_{y,m} = \frac{t_m}{mT_y} \tag{4}$$

.

Column 22 Line 20 Claim 16, should read:

16. A computer program stored on a computer-readable medium for converting an input signal to an output signal wherein the input signal has an input signal sampling rate that is non-uniform, the computer program comprising executable instructions that cause a computer which includes at least one of a microprocessor, a digital signal processor (DSP), or a field-programmable gate array (FPGA) to:

receive the input signal representing, at each of a plurality of first points in time, $\tau$, a first value $x(\tau)$ such that the input signal represents a plurality of first values $x(\tau_0)$ to $x(\tau_n)$ corresponding to separate respective first points in time, $\tau_0$ to $\tau_n$, wherein n is a nonzero integer, generate the output signal responsive to the input signal using the computer, the output signal representing, at each of a plurality of second points in time, t, a second value $y(t)$, such that the output signal represents a plurality of second values $y(t_0)$ to $y(t_m)$ corresponding to separate respective second points it time $t_0$ to $t_m$, wherein m is a nonzero integer, and transmit the output signal, wherein the generating the output signal includes generating the plurality of second values $y(t_0)$ to $y(t_m)$ based on, for each given second point in time $t_m$, determining a corresponding second value $y(t_m)$ based on the computer executing the computer program stored on the computer-readable medium to execute the following Equation (1) that is stored on the computer-readable medium:

$$y(t_m) = h_1(t_m) \sum_{n=0}^{n=\lambda_m} x(\tau_n) * h_2(\tau_n) \tag{1}$$

wherein, in Equation (1), $h_1(t_m)$ is a first factor that is calculated as a first exponential depending on the second point in time $t_m$ but not depending on any of the first points in time $\tau_0$ to $\tau_n$ based on the computer executing the computer program stored on the computer-readable medium, $h_2(\tau_n)$ is a second factor that is calculated as a second exponential depending on the first point in time $\tau_n$ but not depending on any of the second points in time $t_0$ to $t_m$ based on the computer executing the computer program stored on the computer-readable medium, and $\lambda_m$ is calculated based on the computer executing the computer program stored on the computer-readable medium to execute the following Equation (2) that is stored on the computer-readable medium:

$$\lambda_m = \left\lfloor m \frac{T_y \epsilon_{y,m}}{T_x \epsilon_{x,n}} \right\rfloor \qquad (2)$$

wherein, in Equation (2), $T_x$ is a constant that is stored on the computer-readable medium, $T_y$ is another constant that is stored on the computer-readable medium, $\epsilon_{x,n}$ is calculated based on the computer executing the computer program to execute the following Equation (3) that is stored on the computer-readable medium:

$$\epsilon_{x,n} = \frac{t_n}{nT_x}, \qquad (3)$$

and $\epsilon_{y,m}$ is calculated based on the computer executing the computer program to execute the following Equation (4) that is stored on the computer-readable medium:

$$\epsilon_{y,m} = \frac{t_m}{mT_y} \qquad (4)$$
.